(12) United States Patent
Sinangil et al.

(10) Patent No.: US 12,300,312 B2
(45) Date of Patent: *May 13, 2025

(54) PRE-CHARGING BIT LINES THROUGH CHARGE-SHARING

(71) Applicant: Taiwan Semiconductor Manufacturing Company Limited, Hsinchu (TW)

(72) Inventors: Mahmut Sinangil, Campbell, CA (US); Chiting Cheng, Taichung (TW); Hung-Jen Liao, Hsinchu (TW); Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/506,213

(22) Filed: Nov. 10, 2023

(65) Prior Publication Data

US 2024/0079053 A1    Mar. 7, 2024

Related U.S. Application Data

(60) Continuation of application No. 17/010,901, filed on Sep. 3, 2020, now Pat. No. 11,848,047, which is a
(Continued)

(51) Int. Cl.
*G11C 11/419*    (2006.01)
*G11C 7/12*    (2006.01)

(52) U.S. Cl.
CPC .............. *G11C 11/419* (2013.01); *G11C 7/12* (2013.01)

(58) Field of Classification Search
CPC .................................................... G11C 11/419
(Continued)

(56) References Cited

U.S. PATENT DOCUMENTS 4,712,197 A    12/1987  Sood
4,852,064 A    7/1989   Kim et al.
(Continued)

FOREIGN PATENT DOCUMENTS

CN    1385860    12/2002
CN    1750171    3/2006
(Continued)

OTHER PUBLICATIONS

Taiwan Office Action; Appl. No. 106126733; dated Aug. 27, 2020.
Chinese Office Action; Appl. No. 201710674795.8; dated Sep. 1, 2020.

*Primary Examiner* — Sung Il Cho
(74) *Attorney, Agent, or Firm* — Jones Day

(57) ABSTRACT

In one embodiment, a static random access memory (SRAM) device is provided. The SRAM device includes a memory cell, a bit line couple to the memory cell, a voltage supply line coupled to the memory cell, a control circuitry. The control circuitry is configured to charge a voltage supply line while the voltage supply line is electrically isolated from a bit line. A portion of the charge is transferred from the voltage supply line to the bit line. The voltage supply line is recharged while the voltage supply line is electrically isolated from the bit line storing the transferred portion of the charge. The memory cell is accessed using the recharge on the voltage supply line.

20 Claims, 9 Drawing Sheets

Related U.S. Application Data continuation of application No. 16/517,929, filed on Jul. 22, 2019, now Pat. No. 10,847,217, which is a division of application No. 15/896,247, filed on Feb. 14, 2018, now Pat. No. 10,410,715, which is a continuation of application No. 15/231,293, filed on Aug. 8, 2016, now Pat. No. 9,922,701.

(58) Field of Classification Search
USPC .......................................................... 365/154
See application file for complete search history.

(56) References Cited

U.S. PATENT DOCUMENTS

| | | | |
|---|---|---|---|
| 4,893,278 A * | 1/1990 | Ito | G11C 11/419 365/203 |
| 5,034,923 A | 7/1991 | Kuo et al. | |
| 5,173,877 A | 12/1992 | Flannagan et al. | |
| 5,197,032 A | 3/1993 | Nogle | |
| 5,525,918 A | 6/1996 | Reddy | |
| 5,668,770 A | 9/1997 | Itoh et al. | |
| 5,703,816 A | 12/1997 | Nam et al. | |
| 5,982,688 A | 11/1999 | Han | |
| 6,018,488 A | 1/2000 | Mishima et al. | |
| 6,061,287 A | 5/2000 | Serizawa | |
| 6,215,716 B1 | 4/2001 | Itoh et al. | |
| 6,307,797 B1 | 10/2001 | Fournel et al. | |
| 6,724,648 B2 | 4/2004 | Khellah et al. | |
| 6,836,179 B2 | 12/2004 | Mizuno et al. | |
| 6,901,016 B2 | 5/2005 | Miyashita et al. | |
| 7,447,058 B2 | 11/2008 | Maki et al. | |
| 7,672,187 B2 | 3/2010 | Lih et al. | |
| 7,826,298 B2 | 11/2010 | Nakai et al. | |
| 7,995,407 B2 | 8/2011 | Maki | |
| 8,358,524 B1 | 1/2013 | Fabry | |
| 8,379,469 B2 | 2/2013 | Huber et al. | |
| 8,441,843 B2 | 5/2013 | Maeda et al. | |
| 8,446,792 B2 | 5/2013 | Fukushima et al. | |
| 8,553,484 B2 | 10/2013 | Kim et al. | |
| 9,318,162 B2 | 4/2016 | Pilo et al. | |
| 2003/0076705 A1 | 4/2003 | Yamaoka et al. | |
| 2004/0066669 A1 | 4/2004 | Ooishi | |
| 2007/0297249 A1 | 12/2007 | Chang et al. | |
| 2008/0137449 A1 | 6/2008 | Wu et al. | |
| 2009/0296497 A1 * | 12/2009 | Hirabayashi | G11C 5/14 365/189.11 |
| 2011/0158021 A1 | 6/2011 | Wiatrowski et al. | |
| 2011/0211408 A1 | 9/2011 | Koike et al. | |
| 2015/0029807 A1 * | 1/2015 | Huber | G11C 11/417 365/226 |
| 2017/0162255 A1 * | 6/2017 | Huber | G11C 5/14 |

FOREIGN PATENT DOCUMENTS

| | | |
|---|---|---|
| CN | 101383182 | 3/2009 |
| CN | 102148056 | 8/2011 |
| TW | 201214434 | 4/2012 |

* cited by examiner

PRE-CHARGING BIT LINES THROUGH CHARGE-SHARING

CROSS-REFERENCE TO RELATED APPLICATIONS

This application is a continuation of U.S. patent application Ser. No. 17/010,901, filed Sep. 3, 2020 and entitled "Pre-Charging Bit Lines Through Charge-Sharing," which is a continuation of U.S. patent application Ser. No. 16/517,929, filed on Jul. 22, 2019 and entitled "Pre-Charging Bit Lines Through Charge-Sharing," now U.S. Pat. No. 10,847,217 issued Nov. 24, 2020, which is a divisional of U.S. patent application Ser. No. 15/896,247, filed Feb. 14, 2018 and entitled "Pre-Charging Bit Lines Throughout Charge-Sharing," now U.S. Pat. No. 10,410,715 issued Sep. 10, 2019, which is a continuation of U.S. patent application Ser. No. 15/231,293, filed Aug. 8, 2016 and entitled "Pre-Charging Bit Lines Through Charge-Sharing," now U.S. Pat. No. 9,922,701 issued Mar. 20, 2018, the entire contents of which are incorporated by reference herein.

BACKGROUND

The technology described in this patent document relates generally to SRAM devices and more particularly to bit line pre-charge circuitry and methods of pre-charging a bit line in an SRAM device.

Static random access memory (SRAM) is commonly used in electronic devices. SRAM cells have the advantageous feature of holding data without a need for refreshing. SRAM cells may include different numbers of transistors, and are often accordingly referred to by the number of transistors, for example, six-transistor (6T) SRAM, eight-transistor (8T) SRAM, and the like. The transistors typically form a data latch for storing a data bit. Additional transistors may be added to control the access to the transistors. SRAM cells are typically arranged as an array having rows and columns. Typically, each row of the SRAM cells is connected to a word-line, which determines whether the current SRAM cell is selected or not. Each column of the SRAM cells is connected to a bit line (or a pair of bit lines), which is used for storing a data bit into a selected SRAM cell or reading a stored data bit from the selected SRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
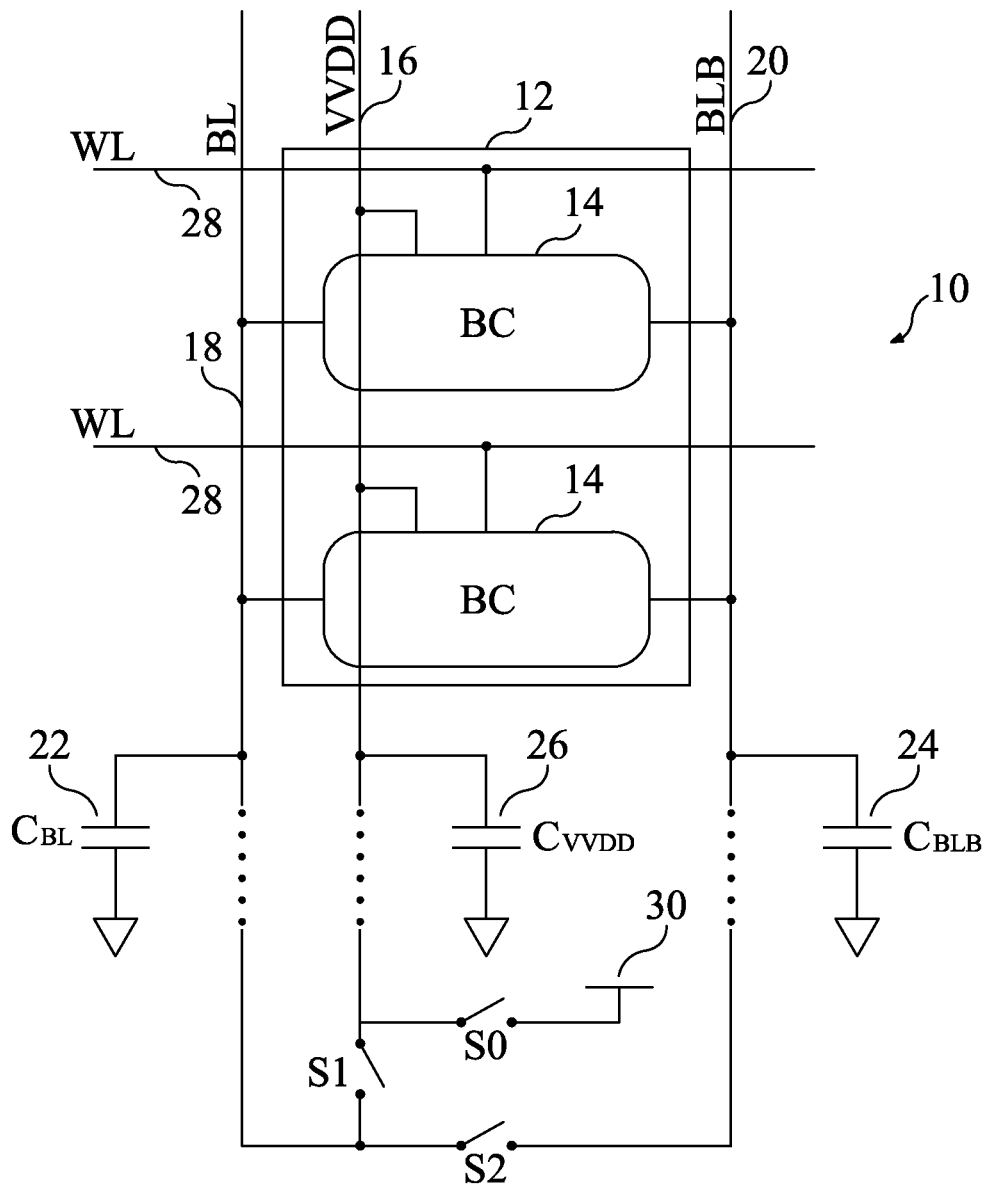
FIG. 1 is a block diagram depicting an example SRAM circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Described herein are techniques for reducing power consumption in SRAM devices and chips incorporating SRAM circuitry. A substantial amount of the total active power dissipated by the SRAM occurs during charging or discharging of bit lines (BLs) during read and write operations. Reducing BL power consumption therefore can result in reduced SRAM active power consumption and consequently to reduced chip active power consumption.

Lower BL power consumption can be achieved by pre-charging BLs to a BL voltage level ($V_{BL}$) less than the memory cell's high voltage level ($V_{DD}$). Pre-charging BLs to $V_{BL}<V_{DD}$ also has the additional benefit of improved read static noise margin and can help improve SRAM $V_{min}$. Creating a pre-charge voltage $V_{BL}<V_{DD}$ can be challenging especially for a wide range of macro sizes and aspect ratios. Described herein is a charge sharing scheme to create a pre-charge voltage that can be constant with respect to macro sizes and aspect ratios.

FIG. 1 is a block diagram of an example SRAM circuit 10. The example SRAM circuit 10 includes a portion of a memory array 12 comprising a plurality of memory or bit cells 14. A high voltage supply line (VVDD) 16 is coupled to each bit cell 16. A bit line (BL) 18 and a complement bit line (BLB) 20 are coupled respectively to a data node and complement data node in each memory cell. The bit line and the complement bit line respectively have a bit line capacitance represented by a bit line capacitor $C_{BL}$ 22 and complement bit line capacitor $C_{BLB}$ 24. The high voltage supply line (VVDD) 16 has a high voltage supply line capacitance represented by a high voltage supply line capacitor $C_{VVDD}$ 26. A word line 28 is also coupled to each bit cell 14.

The example SRAM circuit 10 also includes a set of switches for selectively charging the bit line 18 and the complement bit line 20 to a bit line voltage ($V_{BL}$) that is less than a high voltage level ($V_{DD}$) supplied by a high voltage source 30. Shown is a first switch S0, a second switch S1, and a third switch S2. The first switch S0 is operable to selectively couple the the VVDD 16 to the high voltage source 30 to store charge in $C_{VVDD}$ 26 to charge VVDD 16 to $V_{DD}$. The second switch S1 is operable to selectively couple the BL 18 to VVDD 16 to allow charge stored in $C_{VVDD}$ 26 to be shared with $C_{BL}$ 22 to charge the BL 18 to a bit line voltage level ($V_{BL}$) that is less than $V_{DD}$. When the charge stored in $C_{VVDD}$ 26 is shared with $C_{BL}$ 22, the VVDD 16 is partially discharged to a voltage level that is less than $V_{DD}$ and thus charges the BL 18 to a bit line voltage level ($V_{BL}$) that is less than $V_{DD}$. The third switch S2 is operable to selectively couple the BLB 20 to VVDD 16 (through S1 in this example) to allow charge stored in $C_{VVDD}$ 26 to be shared with $C_{BLB}$ 24 to charge the BLB 20 to a complement bit line voltage level less than $V_{DD}$. In other examples, the third switch S2 is may be coupled more directly to VVDD 16 (e.g., not through S1) to allow charge stored in $C_{VVDD}$ 26 to be shared with $C_{BLB}$ 24 to charge the BLB 20 to a complement bit line voltage level ($V_{BLB}$) that is less than $V_{DD}$. In this example, $V_{BL}$ is substantially equal to $V_{BLB}$.

Figure 2:
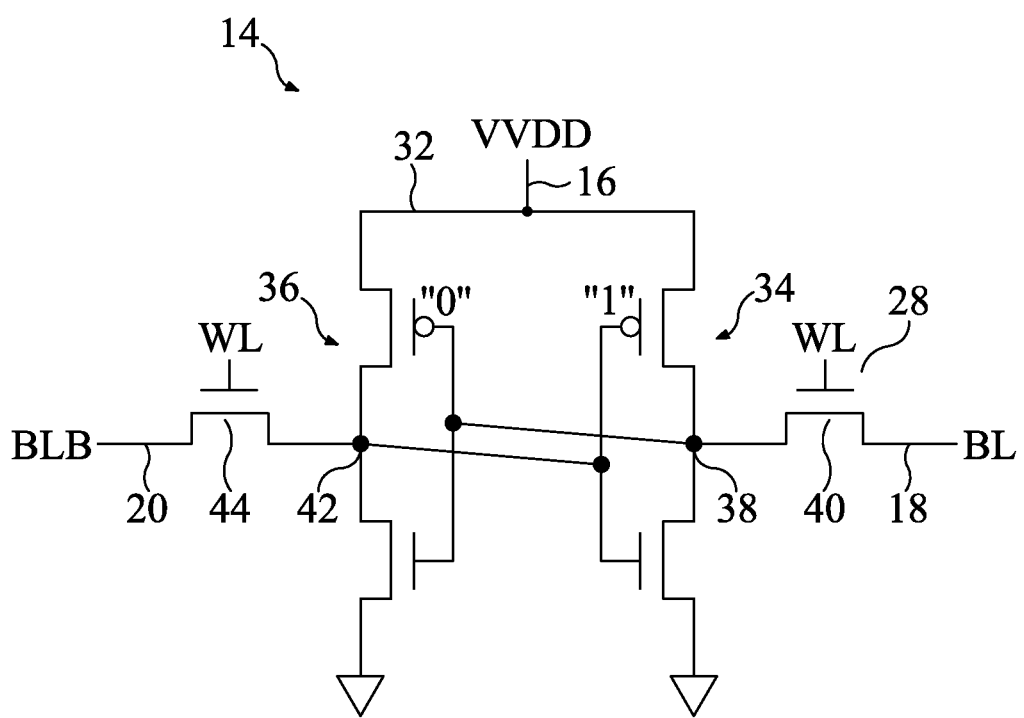
FIG. 2 is a schematic diagram depicting an example SRAM memory cell, in accordance with some embodiments.

FIG. 2 is a schematic diagram depicting an example SRAM memory cell 14. The example memory cell 14 depicted is known in the art as a 6T (six transistor) memory cell. While a 6T memory cell 14 is shown in this example, other types of memory cells such as an 8T, 10T or others may be used in other examples. The example memory cell 14 includes a high voltage supply node 32 coupled to both cross-coupled inverters (34, 36), a data node 38 coupled between the output of one of the cross-coupled inverters (34) and a first pass device 40 driven by the word line 28, and a complement data node 42 coupled between the output of the other cross-coupled inverter (36) and a second pass device 44 driven by the word line 28. The BL 18 is coupled to the data node 38 through the first pass device 40 and the BLB 20 is coupled to the complement data node 42 through the second pass device 44. The high voltage supply line 16 is coupled to the high voltage supply node 32.

Figure 3:
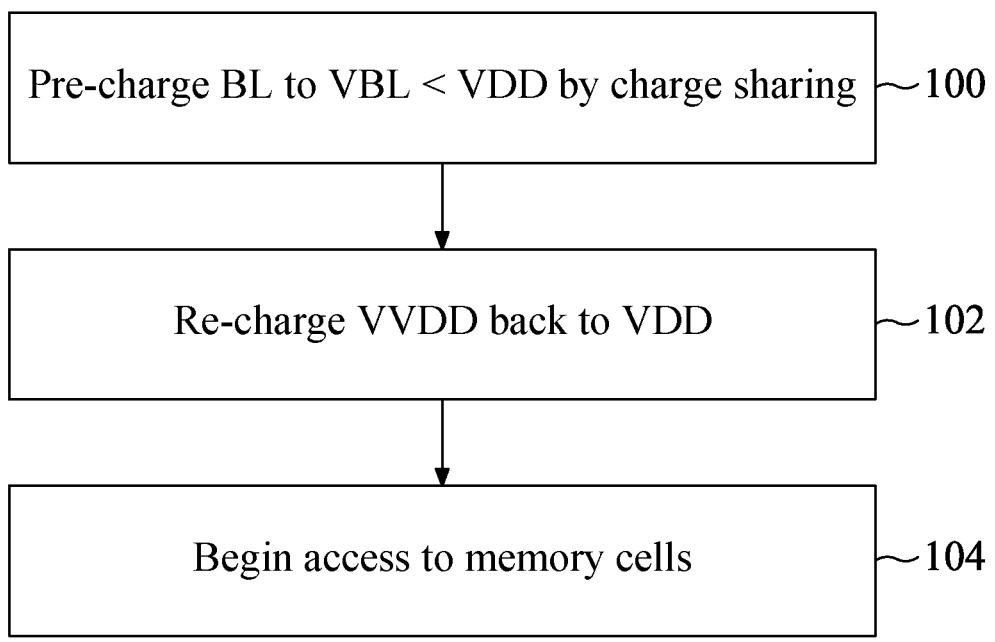
FIG. 3 is a process flow chart illustrating an example method in an SRAM memory circuit for accessing memory cells, in accordance with some embodiments.

FIG. 3 is a process flow chart illustrating an example method in an SRAM memory circuit for accessing memory cells using, for example, the example memory circuits depicted in FIGS. 1 and 2. In the examples of FIGS. 1, 2, and 3, the high voltage supply line VVDD and the BL are coupled to the same memory cells (or alternatively are each connected to sets of memory cells that overlap, i.e., some if not all of the memory cells to which high voltage supply line VVDD is coupled are the same as some if not all of the memory cells to which the BL is connected). In this example method, the BL is pre-charged to a $V_{BL}$ that is less than $V_{DD}$ by charge sharing (operation 100). Stated differently, charge stored in $C_{VVDD}$ is shared with $C_{BL}$ to charge the BL to a bit line voltage level $V_{BL}$ that is less than $V_{DD}$. After the BL is charged, the high voltage supply line VVDD is re-charged to $V_{DD}$ (operation 102). After the high voltage supply line VVDD is recharged to $V_{DD}$, a memory access such as a read or write operation can be completed (operation 104). This method can result in reduced power consumption in the SRAM due to operation using a lower pre-charge $V_{BL}$. While pre-charging the BL is specifically illustrated, the BLB may also be pre-charged in a similar manner. The BLB may be pre-charged to a $V_{BLB}$ that is less than $V_{DD}$ by charge sharing (also during operation 100).

In an alternative mode of operation, the set of switches in the example SRAM circuit 10 may also be operated to selectively charge the bit line 18 and the complement bit line 20 to a bit line voltage ($V_{BL}$) that is substantially equal to the high voltage level ($V_{DD}$) supplied by the high voltage source 30. In this mode of operation, the first switch S0 is always ON to couple the VVDD 16 to the high voltage source 30 to charge VVDD 16 to $V_{DD}$. The second switch S1 is operable to selectively couple the BL 18 to VVDD 16 to charge the BL 18 to a bit line voltage level ($V_{BL}$) that is substantially equal to $V_{DD}$. The third switch S2 is operable to selectively couple the BLB 20 to VVDD 16 (through S1 in this example) to charge the BLB 20 to a complement bit line voltage level substantially equal to $V_{DD}$. In other examples, the third switch S2 is may be coupled more directly to VVDD 16 (e.g., not through S1). In this example, $V_{BL}$ is substantially equal to $V_{BLB}$. This mode of operation allows memory accesses to occur after pre-charging the BL and BLB without having to wait for VVDD to be charged back to $V_{DD}$. This method however does not achieve reduced power consumption in the SRAM as a result of operation using a lower pre-charge $V_{BL}$ and $V_{BLB}$.

Figure 4:
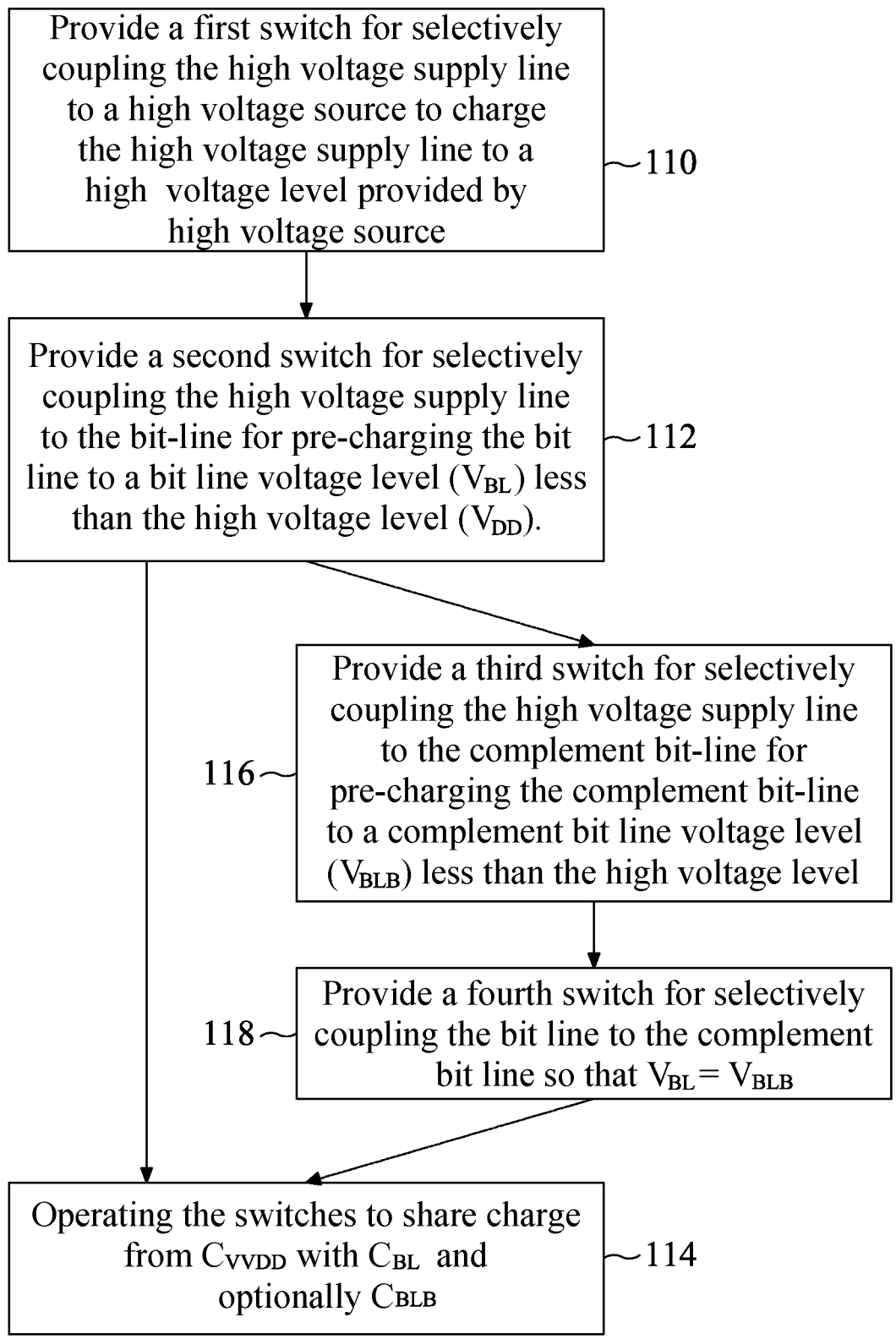
FIG. 4 is a process flow chart illustrating another example method in an SRAM memory circuit for accessing memory cells, in accordance with some embodiments.

FIG. 4 is a process flow chart illustrating another example method in an SRAM memory circuit for accessing memory cells. In this example, a first switch is provided for selectively coupling the high voltage supply line VVDD to a high voltage source to charge the high voltage supply line VVDD to a high voltage level $V_{DD}$ provided by the high voltage source (operation 110). A second switch is also provided for selectively coupling the high voltage supply line to the bit line for pre-charging the bit line BL to a bit line voltage level $V_{BL}$ that is less than the high voltage level $V_{DD}$ (operation 112). The switches are selectively operated to charge $C_{VVDD}$ from the high voltage source and to charge $C_{BL}$ by sharing charge from $C_{VVDD}$ with $C_{BL}$ (operation 114). In addition, a third switch may be provided for selectively coupling the high voltage supply line to the complement bit line for pre-charging the complement bit line BLB to a complement bit line voltage level $V_{BLB}$ that is less than the high voltage level $V_{DD}$ (operation 116). Additionally, a fourth switch may be provided for selectively coupling the bit line to the complement bit line during pre-charging operations so that the bit line voltage level $V_{BL}$ is substantially equal to the complement bit line voltage level $V_{BLB}$ (operation 118). When the third and fourth switches are utilized, those switches are also selectively operated to charge $C_{BLB}$ by sharing charge from $C_{VVDD}$ with $C_{BLB}$ (operation 114). This method can result in the bit line BL and the complement bit line BLB being charged, respectively, to a bit line voltage level $V_{BL}$ and a complement bit line voltage level $V_{BLB}$ that is less than $V_{DD}$ and also can result in reduced power consumption in the SRAM due to operation using a lower pre-charge bit line voltage level $V_{BL}$ and complement bit line voltage level $V_{BLB}$.

Figure 5:
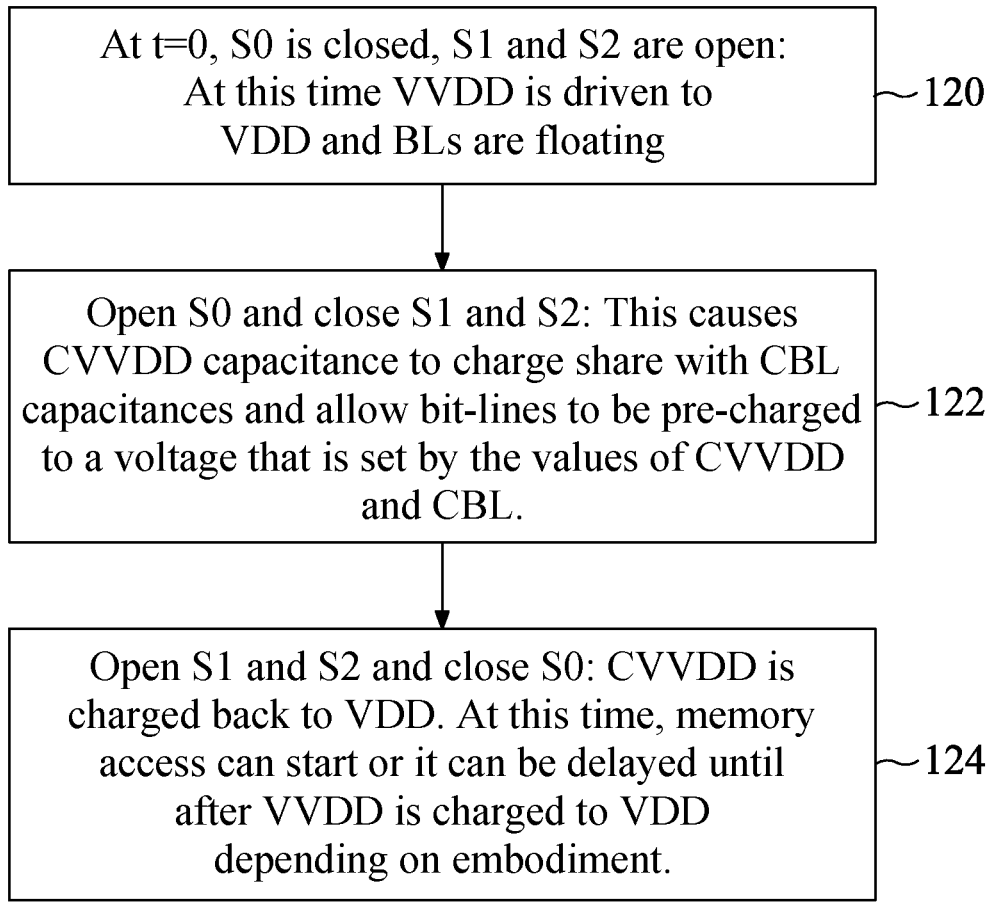
FIG. 5 is a process flow chart illustrating another example method in an SRAM memory circuit for accessing memory cells, in accordance with some embodiments.

FIG. 5 is a process flow chart illustrating another example method in an SRAM memory circuit, such as the example circuit of FIG. 1, for accessing memory cells. In a memory access cycle, the first switch S0 is closed with the second switch S1 and the third switch S2 open (operation 120). This allows the VVDD to be driven to $V_{DD}$ while the bit lines (BL and BLB) are floating. Next, the first switch S0 is opened and the second and third switches (S1, S2) are closed (operation 122). This causes the $C_{VVDD}$ to share charge with the $C_{BL}$ and $C_{BLB}$ and allow the bit lines (BL and BLB) to be pre-charged to a voltage level ($V_{BL}$, $V_{BLB}$) less than $V_{DD}$. The voltage level ($V_{BL}$, $V_{BLB}$) is determined by the values of $C_{VVDD}$, $C_{BL}$ and $C_{BLB}$. Then, the second and third switches (S1, S2) are opened and the first switch S0 is closed (operation 124). Memory access can start or be delayed until after the VVDD is charged back to $V_{DD}$ depending on the embodiment. In embodiments where VVDD is coupled to the same memory cells as the BL and BLB, then access is delayed until after the VVDD is charged back to $V_{DD}$. In embodiments where VVDD is not coupled to the same memory cells as the BL and BLB, then access may not have to be delayed until after the VVDD is charged back to $V_{DD}$.

Figure 6:
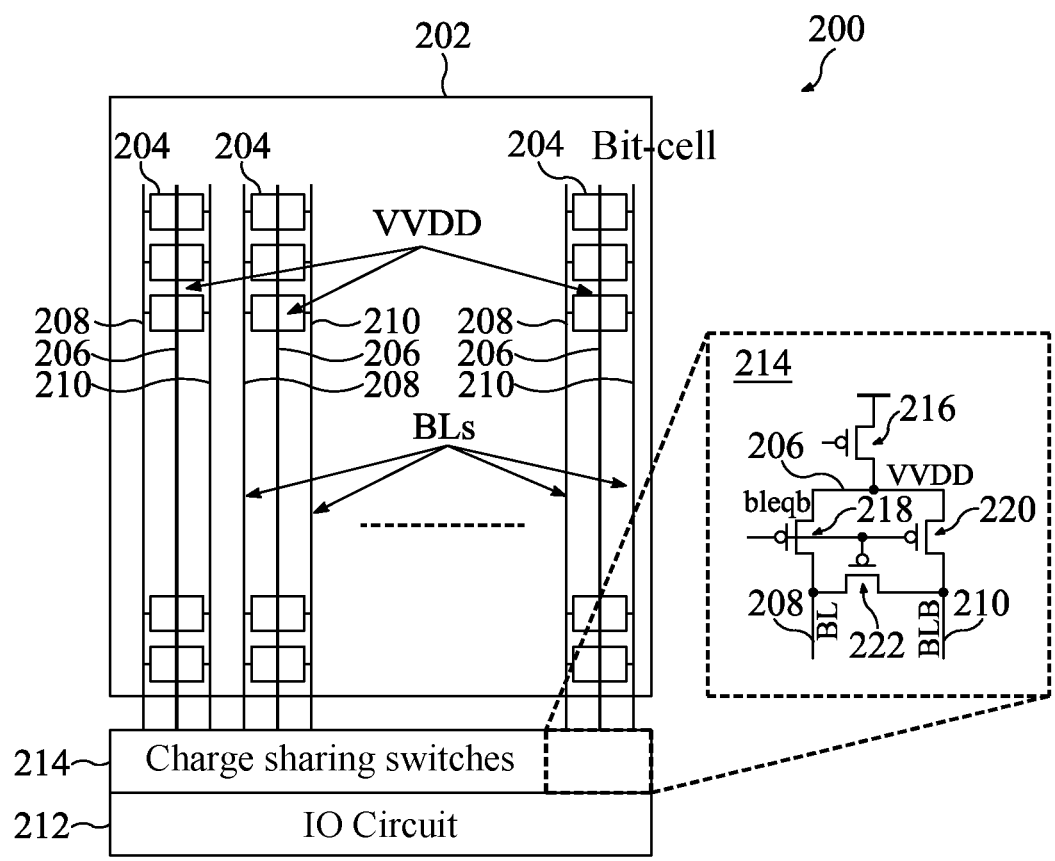
FIG. 6 is a block diagram of an example SRAM containing a single memory array, in accordance with some embodiments.

FIG. 6 is a block diagram of an example SRAM 200 containing a single memory array 202. The memory array 202 contains a plurality of bit cells 204 organized in columns. Each column includes a VVDD 206, a BL 208, and a BLB 210 coupled to the bit cells in the column. The SRAM 200 also includes input/output (I/O) circuitry 212 and sets of charge sharing switches 214 for each column. Each set of charge sharing switches 214 includes a first switch 216, a second switch 218, a third switch 220, and a fourth switch 222.

In this example, the first switch 216 is selectively operable to couple the high voltage supply line VVDD 206 to a high voltage source to charge the high voltage supply line VVDD 206 to a high voltage level $V_{DD}$ supplied by the high voltage source. The second switch 218 is selectively operable to couple the high voltage supply line VVDD 206 to the bit line BL 208 for pre-charging the bit line BL 208 to a bit line voltage level $V_{BL}$ that is less than the high voltage level $V_{DD}$. The third switch 220 is selectively operable to couple the high voltage supply line VVDD 206 to the complement bit line BLB 210 for pre-charging the complement bit line BLB 210 to a complement bit line voltage level $V_{BLB}$ that is less than the high voltage level $V_{DD}$. The fourth switch 222 is selectively operable to couple the bit line BL 208 to the complement bit line BLB 210 during pre-charging operations so that the bit line voltage level $V_{BL}$ is substantially equal to the complement bit line voltage level $V_{BLB}$. The switches are selectively operated to charge the high voltage supply line VVDD 206 to $V_{DD}$ and to charge the bit line voltage level $V_{BL}$ and the complement bit line voltage level $V_{BLB}$ to a level lower than $V_{DD}$. This architecture can result in reduced power consumption in the SRAM due to operation using a lower pre-charge bit line voltage level $V_{BL}$ and complement bit line voltage level $V_{BLB}$. Because VVDD is coupled to the same memory cells as the BL and BLB, memory access will be delayed after pre-charging the BL and BLB until after the VVDD is charged back to $V_{DD}$.

In an alternative mode of operation of the example SRAM 200 of FIG. 6, the set of switches may also be operated to selectively charge the bit line 208 and the complement bit line 210 to a bit line voltage ($V_{BL}$) that is substantially equal to the high voltage level ($V_{DD}$) provided by the high voltage source. In this mode of operation, the first switch 216 is always ON to couple the VVDD 206 to the high voltage source to charge VVDD 206 to $V_{DD}$. The second switch 218 is selectively operable to couple the high voltage supply line VVDD 206 to the bit line BL 208 for pre-charging the bit line BL 208 to a bit line voltage level $V_{BL}$ that is substantially equal to the high voltage level $V_{DD}$. The third switch 220 is selectively operable to couple the high voltage supply line VVDD 206 to the complement bit line BLB 210 for pre-charging the complement bit line BLB 210 to a complement bit line voltage level $V_{BLB}$ that is substantially equal to the high voltage level $V_{BL}$. The fourth switch 222 is selectively operable to couple the bit line BL 208 to the complement bit line BLB 210 during pre-charging operations so that the bit line voltage level $V_{BL}$ is substantially equal to the complement bit line voltage level $V_{BLB}$. This mode of operation allows memory accesses to occur after pre-charging the BL and BLB without having to wait for VVDD to be charged back to $V_{DD}$. This method however does not achieve reduced power consumption in the SRAM as a result of operation using a lower pre-charge $V_{BL}$ and $V_{BLB}$.

Figure 7:
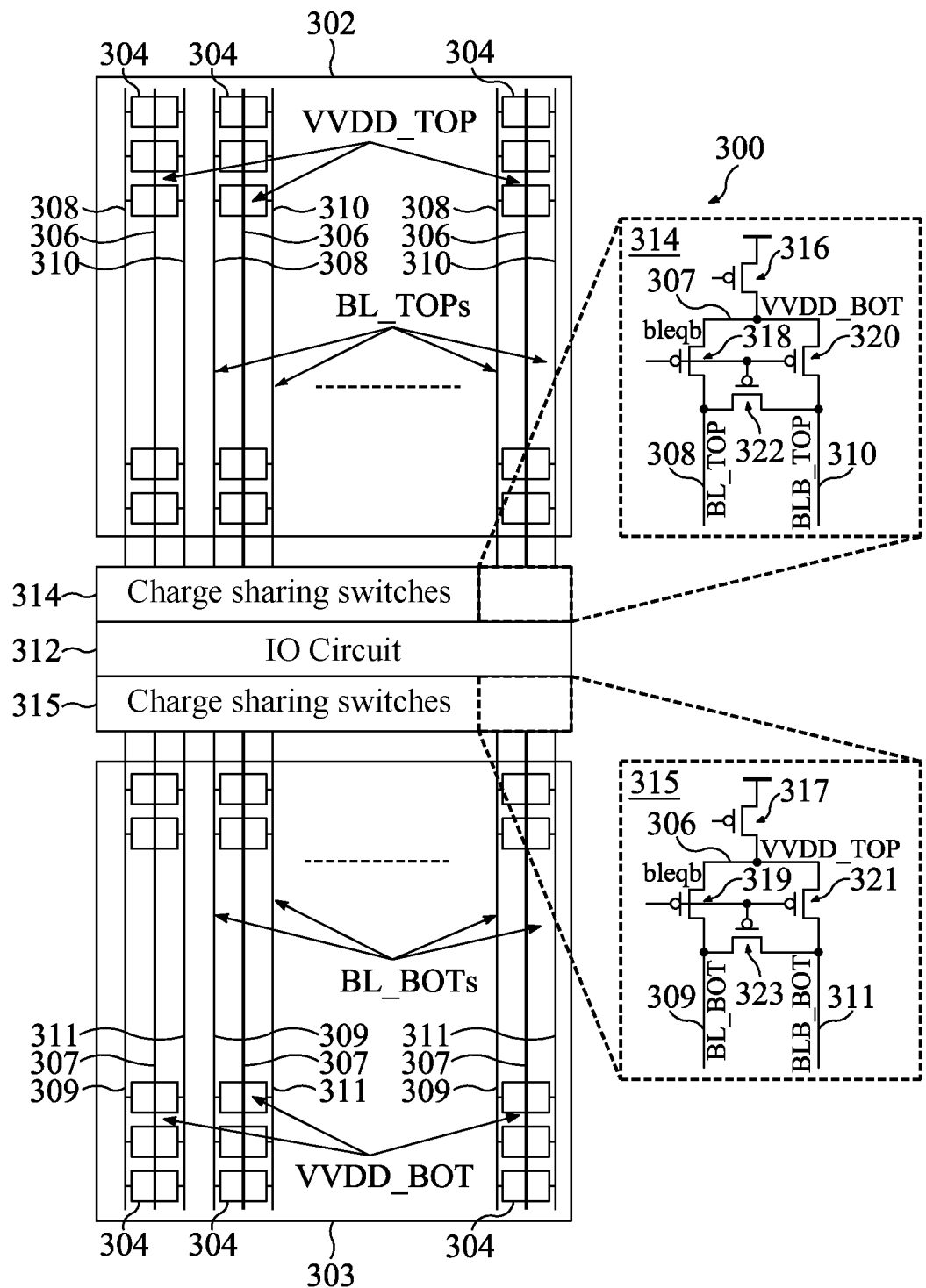
FIG. 7 is a block diagram of an example SRAM having two memory arrays configured in a butterfly architecture, in accordance with some embodiments.

FIG. 7 is a block diagram of an example SRAM 300 having two memory arrays 302, 303 configured in a butterfly architecture. The memory arrays 302, 303 contain a plurality of bit cells 304 organized in columns. Each column includes a VVDD (306, 307), a BL (308, 309), and a BLB (310, 311) coupled to the bit cells in the column. The SRAM 300 also includes input/output (I/O) circuitry 312 and sets of charge sharing switches (314, 315) for each column. Each set of charge sharing switches (314, 315) includes a first switch (316, 317), a second switch (318, 319), a third switch (320, 321), and a fourth switch (322, 323).

In this example, the first switch (316, 317) is selectively operable to couple the high voltage supply line VVDD (306, 307) to a high voltage source to charge the high voltage supply line VVDD (306, 307) to a high voltage level $V_{DD}$ provided by the high voltage source. The second switch (318, 319) is selectively operable to couple the high voltage supply line VVDD (306, 307) to the bit line BL (308, 309) for pre-charging the bit line BL (308, 309) to a bit line voltage level $V_{BL}$ that is less than the high voltage level $V_{DD}$. The third switch (320, 321) is selectively operable to couple the high voltage supply line VVDD (306, 307) to the complement bit line BLB (310, 311) for pre-charging the complement bit line BLB (310, 311) to a complement bit line voltage level $V_{BLB}$ that is less than the high voltage level $V_{DD}$. The fourth switch (322, 323) is selectively operable to couple the bit line BL (308, 309) to the complement bit line BLB (310, 311) during pre-charging operations so that the bit line voltage level $V_{BL}$ is substantially equal to the complement bit line voltage level $V_{BLB}$. The switches are selectively operated to charge the high voltage supply line VVDD (306, 307) to $V_{DD}$ and to charge the bit line voltage level $V_{BL}$ and the complement bit line voltage level $V_{BLB}$ to a level lower than $V_{DD}$. This architecture can result in reduced power consumption in the SRAM due to operation using a lower pre-charge bit line voltage level $V_{BL}$ and complement bit line voltage level $V_{BLB}$.

In this example VVDD from one array is not coupled to the same switches as the BL and BLB from that memory array. For example, VVDD 307, BL 308 and BLB 310 are coupled to one switch set 314 and VVDD 306, BL 309 and BLB 311 are coupled to another switch set 315. This allows memory accesses to occur after pre-charging the BL and BLB without having to wait for VVDD to be charged back to $V_{DD}$. That is because the BL and BLB for an accessed memory cell was not charged with the VVDD coupled to that memory cell. This also allows WL activation and VVDD recovery periods to be overlapped.

Figure 8:
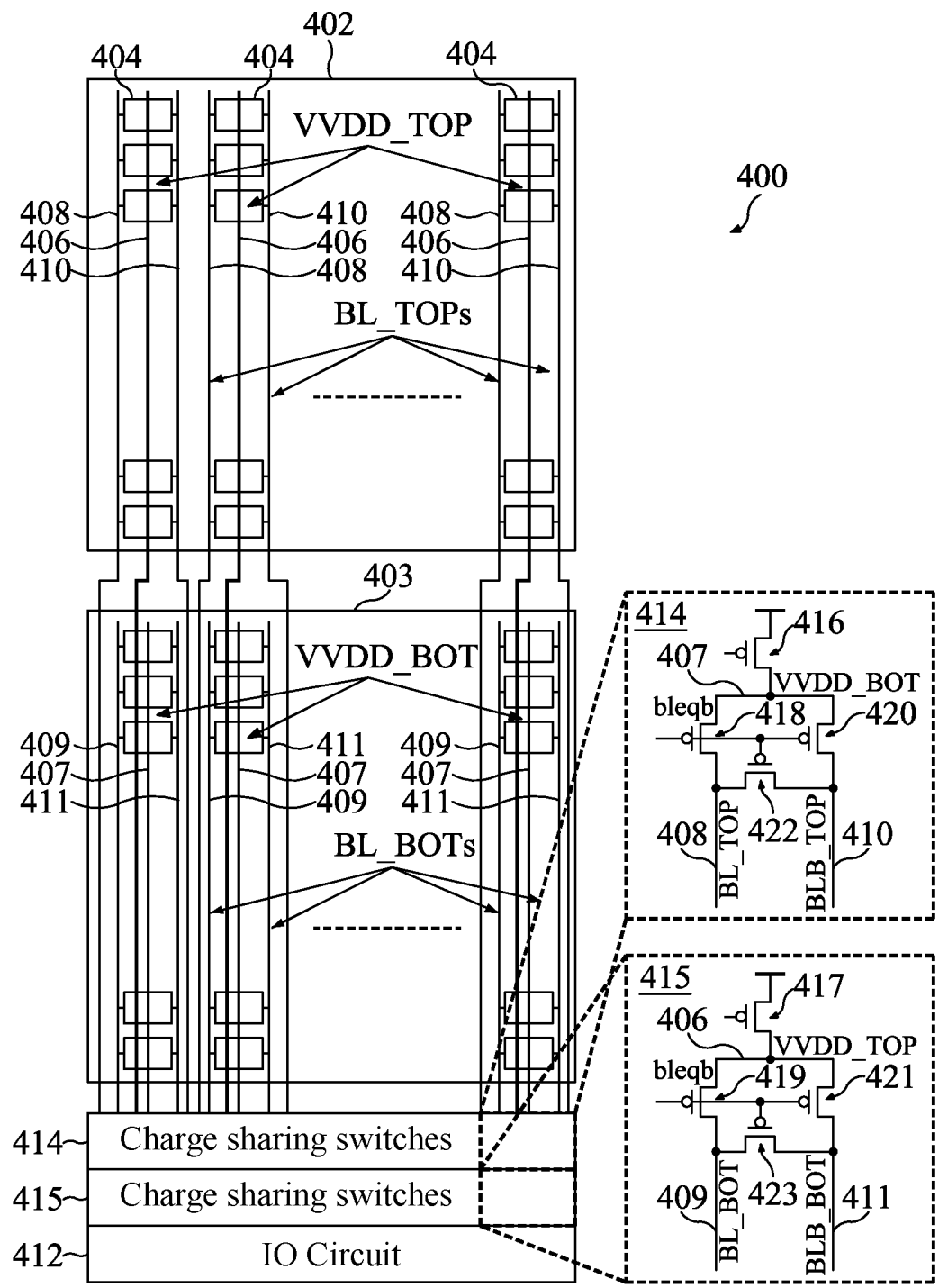
FIG. 8 is a block diagram of another example SRAM having two memory arrays configured in a flying BL array architecture, in accordance with some embodiments.

FIG. 8 is a block diagram of another example SRAM 400 having two memory arrays 402, 403 configured in a flying BL array architecture. The memory arrays 402, 403 contain a plurality of bit cells 404 organized in columns. Each column includes a VVDD (406, 407), a BL (408, 409), and a BLB (410, 411) coupled to the bit cells in the column. The top array's VVDD 406 and bit lines (408, 410) fly over the bottom array at a higher metal level. The SRAM 400 also includes input/output (I/O) circuitry 412 and sets of charge sharing switches (414, 415) for each column. Each set of charge sharing switches (414, 415) includes a first switch (416, 417), a second switch (418, 419), a third switch (420, 421), and a fourth switch (422, 423).

In this example, the first switch (416, 417) is selectively operable to couple the high voltage supply line VVDD (406, 407) to a high voltage source to charge the high voltage supply line VVDD (406, 407) to a high voltage level $V_{DD}$ provided by the high voltage source. The second switch (418, 419) is selectively operable to couple the high voltage supply line VVDD (406, 407) to the bit line BL (408, 409) for pre-charging the bit line BL (408, 409) to a bit line voltage level $V_{BL}$ that is less than the high voltage level $V_{DD}$. The third switch (420, 421) is selectively operable to couple the high voltage supply line VVDD (406, 407) to the complement bit line BLB (410, 411) for pre-charging the complement bit line BLB (410, 411) to a complement bit line voltage level $V_{BLB}$ that is less than the high voltage level $V_{DD}$. The fourth switch (422, 423) is selectively operable to couple the bit line BL (408, 409) to the complement bit line BLB (410, 411) during pre-charging operations so that the bit line voltage level $V_{BL}$ is substantially equal to the complement bit line voltage level $V_{BLB}$. The switches are selectively operated to charge the high voltage supply line VVDD (406, 407) to $V_{DD}$ and to charge the bit line voltage level $V_{BL}$ and the complement bit line voltage level $V_{BLB}$ to a level lower than $V_{DD}$. This architecture can result in reduced power consumption in the SRAM due to operation using a lower pre-charge bit line voltage level $V_{BL}$ and complement bit line voltage level $V_{BLB}$.

Figure 9:
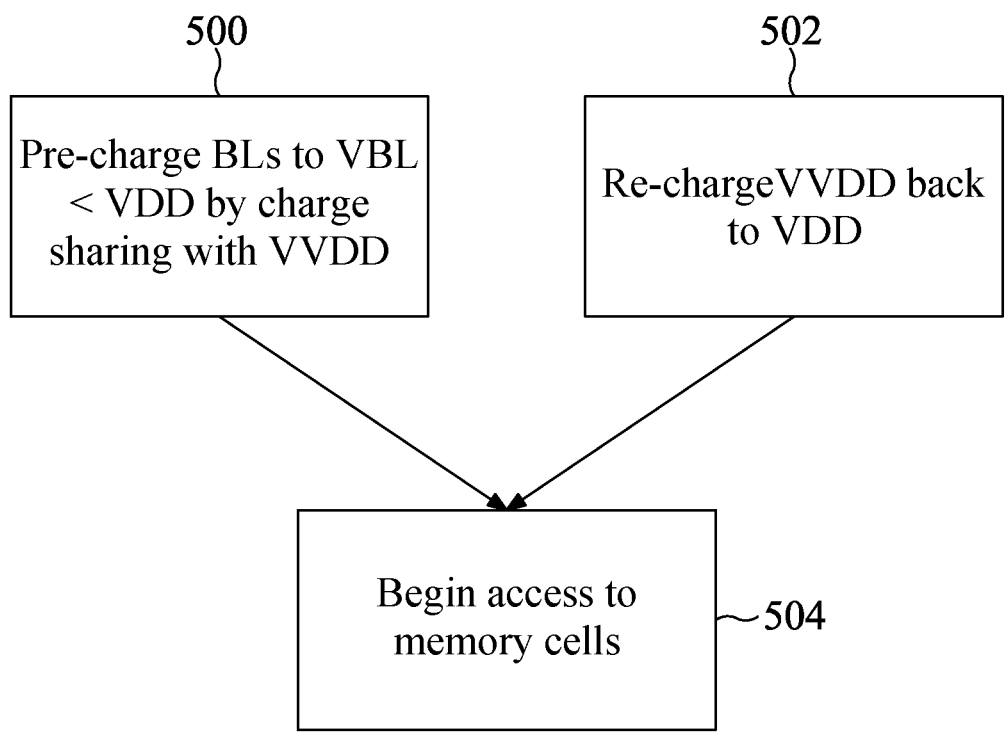
FIG. 9 is a process flow chart illustrating an example method in an SRAM memory device for accessing memory cells, in accordance with some embodiments.

In this example, VVDD from one array is not coupled to the same switches as the BL and BLB from that memory array. For example, VVDD 407, BL 408 and BLB 410 are coupled to one switch set 414 and VVDD 406, BL 409 and BLB 411 are coupled to another switch set 415. This allows memory accesses to occur after pre-charging the BL and BLB without having to wait for VVDD to be charged back to $V_{DD}$. That is because the BL and BLB for an accessed memory cell was not charged with the VVDD coupled to that memory cell. This also allows WL activation and VVDD recovery periods to be overlapped FIG. 9 is a process flow chart illustrating an example method in an SRAM memory device, such as the example memory devices of FIG. 7 or 8, for accessing memory cells. The BL and BLB coupled to a memory cell to be accessed are pre-charged, respectively, to a $V_{BL}$ and $V_{BLB}$ that are less than $V_{DD}$ by charge sharing (operation 500). While the BL and BLB are being pre-charged, the high voltage supply line VVDD coupled to the memory cell to be accessed is charged to $V_{DD}$ (operation 502). This can occur because the VVDD coupled to the accessed memory cell is not used to charge the BL and BLB coupled to that memory cell. This allows memory accesses to occur after pre-charging the BL and BLB without having to wait for VVDD to be charged back to $V_{DD}$ (operation 504). This method can result in reduced power consumption in the SRAM due to operation using a lower pre-charge $V_{BL}$ and $V_{BLB}$.

In an alternative mode of operation of the example memory devices of FIG. 7 or 8, the set of switches may also be operated to selectively charge the bit line and the complement bit line to a bit line voltage ($V_{BL}$) that is substantially equal to the voltage level ($V_{DD}$) provided by the high voltage source. In this mode of operation, the first switch is always ON to couple the VVDD to the high voltage source to charge VVDD to $V_{DD}$. The second switch, third switch, and fourth switch can be selectively operated to charge the bit line voltage level $V_{BL}$ and the complement bit line voltage level $V_{BLB}$ to a voltage level substantially equal to $V_{DD}$. This method however does not achieve reduced power consumption in the SRAM as a result of operation using a lower pre-charge $V_{BL}$ and $V_{BLB}$.

The example methods and SRAM circuits and devices disclose herein provide for pre-charging bit lines through charge sharing with the array's high voltage supply line capacitance. The bit line pre-charge voltage can be set by the capacitive divider between the bit line capacitance and the high voltage supply line capacitance. The technique is scalable to different macro depths/sizes since the bit line capacitance and the high voltage supply line capacitance will also scale. Pre-charge switches may be inserted into an array's column control circuit and timing control handles turning on/off for switches. This technique can be applied to multiple SRAM architectures such as a single array, butterfly array and flying BL array architecture.

In one embodiment, a static random access memory (SRAM) device is provided. The SRAM device comprises a plurality of memory cells, a bit line coupled to a first set of the plurality of memory cells at data nodes, and a first voltage supply line coupled to a second set of the plurality of memory cells. The SRAM device further comprises a first switch for selectively coupling the first voltage supply line to a first voltage source to charge the first voltage supply line to a first voltage level and a second switch for selectively coupling the first voltage supply line to the bit line for pre-charging the bit line to a bit line voltage level that is less than the first voltage level.

These aspects and other embodiments may include one or more of the following features. The bit line has capacitance ($C_{BL}$) and the first voltage supply line has capacitance ($C_{VVDD}$), and wherein the bit line is pre-charged by stored charge being transferred from $C_{VVDD}$ to $C_{BL}$. The SRAM may have a complement bit line coupled to the first set of the plurality of memory cells at complement data nodes wherein the SRAM device has a differential bit line comprising the bit line and the complement bit line, and wherein the complement bit line has a complement bit line capacitance ($C_{BLB}$) and the complement bit line is pre-charged by transferring stored charge from $C_{VVDD}$ to $C_{BLB}$. The SRAM device may have a third switch for selectively coupling the first voltage supply line to the complement bit line for pre-charging the complement bit line to a complement bit line voltage level that is less than the first voltage level. The first switch may be positioned between the first voltage source and the first voltage supply line, the second switch may be positioned between the first voltage supply line and the bit line, and the third switch may be positioned between the second switch and the complement bit line. The first switch may be positioned between the first voltage source and the first voltage supply line, the second switch may be positioned between the first voltage supply line and the bit line, and the third switch may be positioned between the first voltage supply line and the complement bit line. The SRAM device may include a fourth switch that is positioned between the bit line and the complement bit line for selectively pre-charging the bit line and the complement bit line to the same voltage level. The second switch may be adapted to selectively couple the first voltage supply line to the bit line to pre-charge the bit line to a bit line voltage level that is substantially equal to the first voltage level when the first switch is ON. The first set of memory cells may overlap with the second set of memory cells and the first voltage supply line may be configured to be charged to the first voltage level after the bit line is pre-charged to the bit line voltage level. The first set of memory cells may not overlap with the second set of memory cells and the first voltage supply line may be configured to be charged to the first voltage level concurrently with the bit line being pre-charged to the bit line voltage level.

In another embodiment, a static random access memory (SRAM) device is provided. The SRAM device comprises a plurality of memory cells, a first bit line coupled to a first set of the plurality of memory cells, a second bit line coupled to a second set of the plurality of memory cells, a first voltage supply line coupled to the first set of the plurality of memory cells, a second voltage supply line coupled to the second set of the plurality of memory cells, a first switch configured to selectively couple the second voltage supply line to a first voltage source to charge the second voltage supply line to a first voltage level, a second switch configured to selectively couple the first voltage supply line to the first voltage source to charge the first voltage supply line to the first voltage level, a third switch configured to selectively couple the second voltage supply line to the first bit line for pre-charging the first bit line to a first bit line voltage level, and a fourth switch configured to selectively couple the first voltage supply line to the second bit line for pre-charging the second bit line to a second bit line voltage level.

These aspects and other embodiments may include one or more of the following features. The first bit line voltage level may be substantially equal to the second bit line voltage level and the first and second bit line voltage levels may be less than the first voltage level. A first complement bit line may be coupled to the first set of the plurality of memory cells and a second complement bit line may be coupled to the second set of the plurality of memory cells. The third switch may also be configured to selectively couple the second voltage supply line to the first complement bit line for pre-charging the first complement bit line to a first compliment bit line voltage level. The fourth switch may be configured to selectively couple the first voltage supply line to the second complement bit line for pre-charging the second complement bit line to a second complement bit line voltage level. The first complement bit line voltage level may be substantially equal to the second complement bit line voltage level and the first and second complement bit line voltage levels may be less than the first voltage level.

In another embodiment, a method in a static random access memory (SRAM) device is provided. The method comprises coupling a first voltage supply line to a first voltage source to charge the first voltage supply line to a first voltage level, decoupling the first voltage supply line from the first voltage source, and coupling a bit line to the first voltage supply line to charge the bit line to a voltage level less than the first voltage level. The method further comprises decoupling the bit line from the voltage supply line and accessing a memory cell coupled to the bit line.

These aspects and other embodiments may include one or more of the following features. The method may further include coupling the first voltage supply line to the first voltage source after decoupling the bit line from the voltage supply line to recharge the first voltage supply line to the first voltage level. The first voltage supply line and the bit line may be coupled to different memory cells and the first voltage supply line may be recharged during a memory access to a memory cell not coupled to the bit line. The first voltage supply line and the bit line may be coupled to overlapping sets of memory cells and the first voltage supply line may be recharged before accessing the memory cell coupled to the bit line.

In another embodiment, a method in a static random access memory (SRAM) device is provided. The method comprises providing a first switch for selectively coupling a first voltage supply line to a first voltage source to charge the first voltage supply line to a first voltage level, providing a second switch for selectively coupling a bit line to the first voltage supply line to charge the bit line to a second voltage level that is lower than the first voltage level, and operating the first switch and the second switch to charge the bit line to the second voltage level.

These aspects and other embodiments may include one or more of the following features. Operating the first switch and the second switch may comprise charging the first voltage supply line to the first voltage level while the bit line is decoupled from the first voltage supply line. Operating the first switch and the second switch may comprise charging the bit line to the second voltage level by coupling the first voltage supply line to the bit line while the first voltage supply line is decoupled from first voltage source. The method may further comprise operating the first switch and the second switch to recharge the first voltage supply line to the first voltage level after operating the first switch and the second switch to charge the bit line to the second voltage level. The first voltage supply line and the bit line may be coupled to different memory cells and the first voltage supply line may be recharged during a memory access to a memory cell not coupled to the bit line. The first voltage supply line and the bit line may be coupled to overlapping sets of memory cells and the first voltage supply line may be recharged before a memory access to a memory cell coupled to the bit line. The method may further comprise coupling the bit line to the first voltage supply line when the first switch is ON to pre-charge the bit line to a second voltage level that is substantially equal to the first voltage level. The method may further comprise providing a third switch for selectively coupling a complement bit line to the first voltage supply line to charge the complement bit line to the second voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a bit line and a complementary bit line coupled to a memory cell;
 a voltage supply line coupled to the memory cell; and
 a circuit configured to charge the bit line by:
  charging the voltage supply line to a first voltage level while the voltage supply line is electrically isolated from the bit line; and
  transferring a charge from the voltage supply line to the bit line while the voltage supply line is electrically isolated from a voltage source and the complementary bit line.

2. The device of claim 1, wherein the circuit is further configured to electrically isolate the voltage supply line from the bit line by opening a second switch.

3. The device of claim 1, wherein the circuit is further configured to transfer the charge from the voltage supply line to the bit line by closing a second switch.

4. The device of claim 1, wherein the circuit is further configured to charge the voltage supply line while the voltage supply line is electrically isolated from the bit line by opening a second switch and closing a first switch.

5. The device of claim 4, wherein the first switch is coupled between the voltage supply line and the voltage source.

6. The device of claim 1, further comprising:
a third switch coupled between the bit line or the voltage supply line and the complementary bit line.

7. The device of claim 6, wherein a gate terminal of a second switch and a gate terminal of the third switch are coupled to each other.

8. The device of claim 1, wherein the circuit is further configured to charge the voltage supply line to the first voltage level by storing a charge in a line capacitor of the voltage supply line.

9. The device of claim 1, wherein the circuit is further configured to charge the bit line to a second voltage level by sharing a charge stored in a line capacitor of the voltage supply line with a line capacitor of the bit line.

10. The device of claim 1, wherein the circuit is further configured to charge the complementary bit line prior to or after the bit line.

11. The device of claim 1, wherein the voltage supply line is directly coupled to the memory cell.

12. The device of claim 1, wherein the circuit is further configured to electrically isolate the voltage supply line from the bit line and the complementary bit line by opening second and third switches.

13. A method comprising:
simultaneously charging a bit line to a second voltage level and a complementary bit line to a third voltage level by:
charging a voltage supply line that is directly coupled to a memory cell to a first voltage level;
transferring a charge from the voltage supply line to the bit line while the voltage supply line is electrically isolated from a voltage source; and
transferring the charge from the voltage supply line to the complementary bit line while the voltage supply line is electrically isolated from the voltage source.

14. The method of claim 13, wherein transferring the charge to the bit line or the complementary bit line includes capacitively storing the charge on the bit line or the complementary bit line, the method further comprising:
charging the voltage supply line to the first voltage level by closing a first switch and opening second and third switches;
storing the charge on the bit line by opening the second switch; and
storing the charge on the complementary bit line by opening the third switch.

15. The method of claim 13, further comprising accessing a memory cell using the charge on the bit line, the charge on the complementary bit line, and the charge on the voltage supply line.

16. The method of claim 13, wherein charging the voltage supply line includes charging the voltage supply line to the voltage source.

17. A device comprising:
a circuit configured:
to charge a bit line by:
charging a voltage supply line to a first voltage level; and
transferring a charge from the voltage supply line to the bit line to charge the bit line to a second voltage level while the voltage supply line is electrically isolated from a voltage source and a complementary bit line, wherein the bit line and the complementary bit line are connected to a memory cell; and
to charge the complementary bit line, prior to or after the bit line, by:
transferring the charge from the voltage supply line to the complementary bit line to charge the complementary bit line to a third voltage level while the voltage supply line is electrically isolated from the voltage source.

18. The device of claim 17, wherein the circuit is further configured to charge the voltage supply line while the voltage supply line is electrically isolated from the bit line and the complementary bit line by closing a first switch.

19. The device of claim 17, wherein the circuit is further configured to electrically isolate the voltage supply line from the bit line and the complementary bit line by opening second and third switches.

20. The device of claim 17, wherein the circuit is further configured to access the memory cell using the charge on the voltage supply line.

* * * * *